US007591270B2

(12) United States Patent
Zhang et al.

(10) Patent No.: US 7,591,270 B2
(45) Date of Patent: Sep. 22, 2009

(54) PROCESS SOLUTIONS CONTAINING SURFACTANTS

(75) Inventors: Peng Zhang, Quakertown, PA (US); Danielle Megan King Curzi, Center Valley, PA (US); Eugene Joseph Karwacki, Jr., Orefield, PA (US); Leslie Cox Barber, Cave Creek, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 175 days.

(21) Appl. No.: 11/520,971

(22) Filed: Sep. 14, 2006

(65) Prior Publication Data

US 2007/0010409 A1    Jan. 11, 2007

Related U.S. Application Data

(63) Continuation of application No. 10/616,662, filed on Jul. 10, 2003, now Pat. No. 7,129,199, which is a continuation-in-part of application No. 10/218,087, filed on Aug. 12, 2002, now abandoned, and a continuation-in-part of application No. 10/339,709, filed on Jan. 9, 2003, now abandoned.

(51) Int. Cl.
 *B08B 3/08* (2006.01)
 *C11D 7/32* (2006.01)
(52) U.S. Cl. .................. 134/1.3; 134/902; 510/175; 510/176; 430/331; 430/322
(58) Field of Classification Search ................ 510/175, 510/176; 134/1.3, 902; 430/331, 322
 See application file for complete search history.

(56) References Cited

U.S. PATENT DOCUMENTS

| | | | | |
|---|---|---|---|---|
| 4,824,763 | A * | 4/1989 | Lee | ............. 430/258 |
| 4,833,067 | A | 5/1989 | Tanaka et al. | |
| 5,127,571 | A | 7/1992 | Gutierrez et al. | |
| 5,399,464 | A * | 3/1995 | Lee | ............. 438/514 |
| 5,650,543 | A | 7/1997 | Medina | |
| 5,756,267 | A | 5/1998 | Matsuda et al. | |
| 5,948,464 | A | 9/1999 | Deinick | |
| 5,977,041 | A | 11/1999 | Honda | |
| 6,110,881 | A * | 8/2000 | Lee et al. | ............. 510/175 |
| 6,152,148 | A | 11/2000 | George et al. | |
| 6,261,466 | B1 | 7/2001 | Bayes et al. | |
| 6,261,745 | B1 | 7/2001 | Tanabe et al. | |
| 6,268,115 | B1* | 7/2001 | Lassila et al. | ............. 430/331 |
| 6,313,182 | B1 | 11/2001 | Lassila et al. | |
| 6,319,885 | B1* | 11/2001 | Lee et al. | ............. 510/175 |
| 6,455,234 | B1 | 9/2002 | Lassila et al. | |
| 6,641,986 | B1 | 11/2003 | Zhang et al. | |
| 6,670,107 | B2 | 12/2003 | Lachowski | |
| 7,129,199 | B2* | 10/2006 | Zhang et al. | ............. 510/175 |
| 2002/0016272 | A1 | 2/2002 | Kakizawa et al. | |
| 2002/0055660 | A1 | 5/2002 | Lassila et al. | |
| 2002/0115022 | A1 | 8/2002 | Messick et al. | |
| 2004/0029396 | A1 | 2/2004 | Zhang et al. | |
| 2004/0137379 | A1* | 7/2004 | Ikemoto | ............. 430/331 |

FOREIGN PATENT DOCUMENTS

| | | |
|---|---|---|
| EP | 1095988 A2 | 5/2001 |
| EP | 1 115 033 A1 | 7/2001 |
| EP | 1 115 035 A1 | 7/2001 |
| EP | 1115033 A1 | 7/2001 |
| EP | 1115035 A1 | 7/2001 |
| EP | 1 115 035 A1 | 11/2001 |
| EP | 1 245 650 A2 | 10/2002 |
| EP | 1277829 A2 | 1/2003 |
| EP | 1297876 A2 | 4/2003 |
| EP | 1 389 745 A1 | 2/2004 |
| EP | 1 389 746 A2 | 2/2004 |
| EP | 1389745 A1 | 2/2004 |
| EP | 0 671 662 A1 | 9/2005 |
| EP | 1389746 A2 | 9/2007 |
| JP | 01088547 | 4/1989 |
| JP | 95142349 A | 6/1995 |
| JP | 96008163 A | 6/1996 |
| JP | 10-171128 A | 6/1998 |
| JP | 2001-33988 A | 2/2001 |
| JP | 2001-194777 A | 7/2001 |
| JP | 2001-215690 A | 8/2001 |
| JP | 2003-10774 | 4/2003 |
| JP | 2003-524213 A | 8/2003 |
| JP | 2004-078217 | 3/2004 |
| JP | 2004184648 A | 7/2004 |
| TW | 247799 | 1/2006 |
| WO | WO 87/03387 | 6/1987 |

(Continued)

OTHER PUBLICATIONS

W.D. Domke, et al., "Pattern Collapse in High Aspect Ration DUV and 193nm Resists," Proc. SPIE-Int. Soc. Opt. Eng. 3999, 313-321, 2000.

C. Cheung, et al., "A Study of a Single Closed Contact for 0.18 Micron Photolithography Process," Proc. SPIE-Int. Soc. Opt. Eng. 3998, 738-741, 2000.

S. Hien, et al., "Collapse behavior of single layer 193 and 157 nm resists: Use of surfactants in the rinse to realize the sub 130 nm nodes," Infineon Technologies, International SEMATECH, Center for Nano Technology, University of Wisconsin.

T. Tanaka, et al., "Mechanism of Resist Pattern Collapse During Development Process," Jpn. J. Appl. Phys. vol. 32 (1993), pp. 6059-6064, Part 1, No. 12B.

(Continued)

*Primary Examiner*—Douglas Mc Ginty
(74) *Attorney, Agent, or Firm*—Rosaleen P. Morris-Oskanian

(57) ABSTRACT

Process solutions comprising one or more surfactants are used to reduce the number of pattern collapse defects on a plurality of photoresist coated substrates during the manufacture of semiconductor devices.

15 Claims, 1 Drawing Sheet

FOREIGN PATENT DOCUMENTS

| | | |
|---|---|---|
| WO | WO 99/15609 | 4/1999 |
| WO | WO 99/60083 | 11/1999 |
| WO | WO 99/60448 | 11/1999 |
| WO | WO 00/03306 | 6/2000 |
| WO | 01/63365 A1 | 8/2001 |
| WO | 02/23598 A2 | 3/2002 |
| WO | WO 02/23598 A2 | 3/2002 |
| WO | WO 2004/051379 | 6/2004 |

OTHER PUBLICATIONS

P. Zhang, et al., "Surface Conditioning Solutions to Reduce Resist Line Roughness," Air Products and Chemicals, Inc., SPIE International Symposium Microlithography, Feb. 22-27, 2004, Santa Clara, CA.

* cited by examiner

PROCESS SOLUTIONS CONTAINING SURFACTANTS

CROSS-REFERENCE TO RELATED APPLICATIONS

This application is continuation of U.S. patent application Ser. No. 10/616,662, filed Jul. 10, 2003, now U.S. Pat. No. 7,129,199, which is a continuation-in-part of U.S. patent application Ser. Nos. 10/218,087, filed 12 Aug. 2002, now abandoned, and 10/339,709, filed 9 Jan. 2003, now abandoned, the disclosures of which are incorporated herein by reference in their entirety.

BACKGROUND OF THE INVENTION

The present invention relates generally to methods for the manufacture of semiconductor devices. More specifically, the present invention relates to a method for reducing defects, particularly pattern collapse, in semiconductor devices incurred during the manufacturing process without sacrificing throughput.

Defects are a major limiting factor for production yield and device function, particularly when the device sizes are reduced and wafer sizes are enlarged to 300 mm. The term "defects", as used herein, relates to defects that may reduce the yield, or cause the loss, of the semiconductor device such as the collapse of the photoresist pattern on the substrate surface; particulates introduced onto the substrate resulting from processing such as lithography, etching, stripping, and chemical mechanical planarization (CMP) residues; particulates either indigenous to or resulting from manufacturing processes; pattern imperfections such as closed or partially open or blocked contacts or vias; line width variations; and defects resulting from poor adhesion of the resist to the substrate surface.

The drive to reduce defects—thereby improving yield—presents new challenges to the manufacturing steps within the production of the semiconductor device, namely, the lithography, etching, stripping, and chemical-mechanical planarization (CMP) processes. The lithography process generally involves coating a substrate with a positive or negative photoresist, exposing the substrate to a radiation source to provide an image, and developing the substrate to form a patterned photoresist layer on the substrate. This patterned layer acts as a mask for subsequent substrate patterning processes such as etching, doping, and/or coating with metals, other semiconductor materials, or insulating materials. The etching process generally involves removing the surface of the substrate that is not protected by the patterned photoresist using a chemical or plasma etchant thereby exposing the underlying surface for further processing. The stripping process generally involves removing the cross-linked, photoresist pattern from the substrate via wet stripping or oxygen plasma ashing. The CMP process generally involves polishing the surface of the substrate to maintain flatness during processing. All of the aforementioned processes typically employ a rinse step to remove any particulate material that is generated from, or is a by-product of, these processes.

Pattern collapse is becoming an emerging problem in the production of semiconductor devices due to the higher aspect ratios in the new generation of devices. The thickness and aspect ratio of the patterned photoresist layer are important parameters for subsequent etch steps after lithography. At the 130 nm node, the aspect ratio for a photoresist layer having a 500 nm thickness may reach the value of 4. This value may be the point where the capillary force of the developer and/or rinse solution may lead to the collapse of the patterned photoresist layer. Besides capillary forces, the pattern collapse problem may be further influenced by other factors such as the mechanical strength of the resist, application of other coatings, i.e., anti-reflective coatings (ARC), and the nozzle type, position, and centrifugal forces during spin-on application of the photoresist layer.

A main contributor for pattern collapse is the capillary force of water during the post-development drying stage, see Tanaka, T., et al., "Mechanism of Resist Pattern Collapsed During Developer Process", Jpn. J. Appl. Phys., Vol. 32, 1993, pp. 6059-64. Reducing or eliminating the surface tension of the rinse liquid after pattern development may be used to reduce the capillary force that is exerted on the patterned photoresist layer. Two common approaches, to reduce or eliminate the surface tension of the rinse liquid, may be to freeze-dry the patterned photoresist features or employ supercritical fluids to dry the patterned photoresist layer after development. Both of these approaches may require extra manufacturing steps and special equipment that are not commonly used in semiconductor device fabrication.

A more common approach to reduce the surface tension may be to add a surfactant to the rinse liquid. The ability to reduce the surface tension of water at the air and liquid interface is of great importance in a variety of applications because decreased surface tension generally relates to increased wetting of water on the substrate surface. Surface tension reduction in water-based systems is generally achieved through the addition of surfactants. Equilibrium surface tension performance is important when the system is at rest, though the ability to reduce surface tension under dynamic conditions is of great importance in applications where high surface creation rates are used, i.e., spin coating, rolling, spray coating, and the like. Dynamic surface tension provides a measure of the ability of the solution to lower surface tension and provide wetting under high speed application conditions. Further, in certain applications such as during spray application, it is advantageous that the surfactant reduces the surface tension of the formulation in a manner that minimizes the problem of bubble generation and foaming. Foaming and bubble generation may lead to defects Consequently, considerable efforts have been made in the semiconductor industry towards solving the foaming problem.

Japanese patent JP 95142349A describes adding a fluorine-based surfactant such as ammonium perfluoroalkylsulfonate or perfluoroalkyl ethoxylate to the developer solution or rinse liquid.

U.S. Pat. No. 6,152,148 describes adding a surfactant such as a fluorosurfactant and a tetra alkyl quarternary ammonium hydroxide compound to an aqueous solution used to clean semiconductor wafers having a poly(arylene ether) dielectric film coating after CMP.

The article, Domke, W. D et al., "Pattern Collapse in High Aspect Ratio DUV—and 193 nm Resists", Proc. SPIE-Int. Soc. Opt. Eng. 3999, 313-321,2000 ("Domke"), describes adding surfactants to the developer solution to reduce the possibility of pattern collapse of acrylic and cycloolefin-maleic anhydride resists. The "surfactant" added to developer solution was the solvent, isopropyl alcohol. According to Domke, the addition of the "surfactant" in the developer solution did not have a consistent effect on pattern collapse.

PCT application WO 02/23598 describes adding the surfactant ammonium lauryl sulfate into the deionized (DI) water rinse and developer and applying them to a patterned photoresist to minimize or eliminate post-development defects.

Japanese Patent Application JP 96008163A describes adding hot water, an organic solvent, and a surfactant to a post-development rinse to prevent pattern collapse. No specific surfactants were mentioned.

PCT application 87/03387 describes protecting photoresist images against distortion or degradation by heat generated during etching and other processes by applying a thermally stabilizing, protective film to the substrate prior to the post-development bake of the image. Materials used for the film includes fluorocarbon surfactants, film forming polymers, chromium sulfate, trichloroacetic acid, chromotropic acid, and salts thereof.

The article, Cheung, C. et al., "A Study of a Single Closed Contact for 0.18 micron Photolithography Process" Proc. SPIE-Int. Soc. Opt. Eng. 3998, 738-741, 2000 ("Cheung"), discloses the use of surfactants such as octyl and nonyl phenol ethoxylates such as TRITON® X-114, X-102, X-45, and X-15, in the rinse solution to eliminate the photoresist residue and single closed contact defects. According to Cheung, the use of surfactant in the rinse solution did not provide much success.

U.S. Pat. No. 5,977,041 describes a post-stripping, aqueous rinse solution that includes water, a water soluble organic acid, and a water soluble surface-active agent. The surface-active agents include oligo(ethylene oxide) compounds having at least one acetylenic alcohol group.

WO 00/03306 describes a stripper composition that comprises an admixture of a solvent and a surfactant wherein the amount of solvent ranges from about 50 to about 99.9 weight percent of the total composition and the amount of surfactant ranges from about 0.1 to about 30 weight percent of the total composition.

U.S. Patent Application No. 2002/0115022 describes a developer and a rinse solution that each contains an anionic surfactant such as ammonium perfluoralkyl sulfonate or ammonium perfluoralkyl carboxylate. These solutions are applied in a consecutive sequence to reduce pattern collapse.

The article "Collapse Behavior of Single Layer 193 and 157 nm Resists: Use of Surfactants in the Rinse to Realize the Sub 130 nm Nodes: Hien et al., Advances in Resist Tech. And Processing XIX, Proceedings of SPIE, Vol. 4690 (2002), pp. 254-261 ("Hien"), applying a rinse solution of 0.10 % of a fluorosurfactant and water to a substrate after development to reduce pattern collapse. According to Hein, some of the fluorosurfactants used worsened the collapse behavior.

Although surfactants have been commonly used as a post-development rinse solution, these solutions may not be effective in reducing the surface tension under dynamic conditions. Further, these solutions may have the undesirable side effect of foam generation. Because of these issues, the rinse solution using typical surfactants used in the art may not be effective in reducing all of the defects, particularly pattern collapse defects, in the semiconductor device.

All references cited herein are incorporated herein by reference in their entirety.

BRIEF SUMMARY OF THE INVENTION

The present invention satisfies some, if not all, of the needs of the art by providing a process solution and methods for using same. Specifically, in one aspect of the present invention, there is provided a method for reducing the number of pattern collapse defects during the manufacture of semiconductor devices, the method comprising: providing a substrate comprising a photoresist coating; exposing the substrate to a radiation source to form a pattern on the photoresist coating; applying a developer solution to the substrate to form a patterned photoresist coating; optionally rinsing the substrate with deionized water; and contacting the substrate with a process solution comprising at least one solvent and 10 ppm to about 10,000 ppm of at least one surfactant having the formula (III), (IVa), (IVb), (V), (VII), or (VIII):

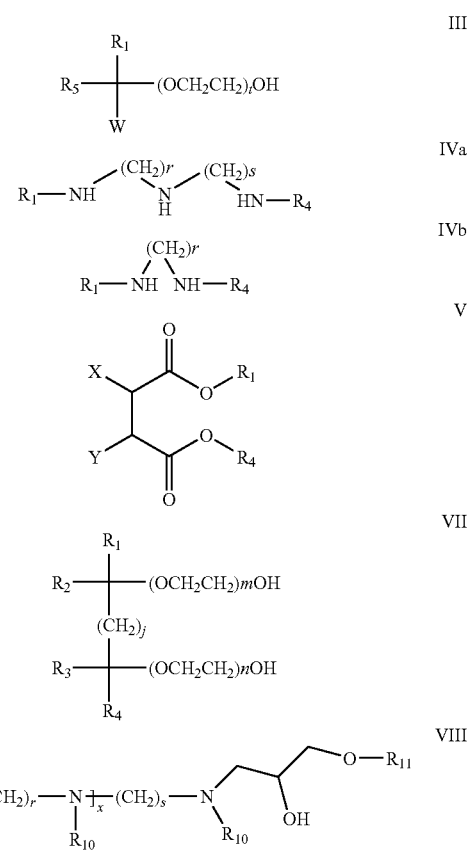

wherein $R_1$ and $R_4$ are each independently a straight or a branched alkyl group having from 3 to 10 carbon atoms; $R_2$ and $R_3$ are each independently a hydrogen atom or an alkyl group having from 1 to 5 carbon atoms; $R_5$ is a straight or a branched alkyl group having from 1 to 10 carbon atoms; $R_6$ is a straight or a branched alkyl group having from 4 to 16 carbon atoms; $R_7$, $R_8$, and $R_9$ are each independently a straight or a branched alkyl group having from 1 to 6 carbon atoms; $R_{10}$ is independently H or a group represented by the formula

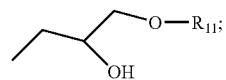

$R_{11}$ is a straight, branched, or cyclic alkyl group having from 4 to 22 carbon atoms; W is a hydrogen atom or an alkynyl group; X and Y are each independently a hydrogen atom or a hydroxyl group; Z is a halide atom, a hydroxyl group, an acetate group, or a carboxylate group; m, n, p, and q are each independently a number that ranges from 0 to 20; r and s are each independently 2 or 3; t is a number that ranges from 0 to 2; j is a number that ranges from 1 to 5; and x is a number that ranges from 1 to 6.

This and other aspects of the invention will become apparent from the following detailed description.

DETAILED DESCRIPTION OF THE INVENTION

Figure 1A:
FIG. 1a provides a cross-sectional scanning electron micrograph (SEM) image of a 193 nm photoresist coated substrate having 80 nm dense lines, a 1:1 pitch, and a 3.75 aspect ratio that has been treated with a deionized water rinse.

The present invention is directed to process solutions that are used to reduce the number of defects incurred during the manufacturing of the semiconductor device and methods of using same. The surfactant within the process solution—present in minor amounts—aids in removing particulates that may lead to defects through dispersion. In certain preferred embodiments, the process solution of the present invention may reduce post-development defects by improving the wetting of the solution on the surface of the patterned photoresist layer. The improved wetting of the process solution may remove any residues left inside the contact holes or within dense features. The process solution of the present invention, when employed as a post-development rinse, may also reduce the capillary forces exerted on the patterned lines thereby contributing to pattern collapse defects. Further, the process solution works more effectively in dynamic rinse situations with relatively minor foam generation compared to other surfactants presently used in the art.

The process solution of the present invention can be used in a variety of processes related to the manufacture of a semiconductor device such as for example, lithography process solutions, i.e., rinse, resist, edge bead remover, and antireflective coating (ARC) solutions; post-etching process solutions, i.e., sidewall film, stripper, post-strip/ash rinse solutions; wafer cleaning process solutions, i.e., additives to RCA or other standard cleaning solutions, super-critical $CO_2$ cleaning solutions; and process solutions for critical cleaning or precision cleaning for aerospace applications. In certain preferred embodiments, the process solution of the present invention may be employed as a lithography rinse solution. The surfactant within the process solution may allow for the reduction of equilibrium and dynamic surface tension while minimizing foaming.

The process solution of the present invention may have as a carrier phase or medium an aqueous-based solvent and/or non-aqueous-based solvent. The term "aqueous" as used herein, describes a solvent or liquid dispersing medium, which comprises at least 80 weight percent, preferably 90 weight percent, and more preferably at least 95 weight percent water. The preferred aqueous-based solvent is deionized water. In embodiments wherein the process solution is aqueous-based, it is desirable that at least one formula I through VIII surfactant demonstrates a dynamic surface tension of less than 45 dynes/cm at a concentration of less than or equal to 5 weight percent in water at 23° C. and 1 bubble/second according to the maximum-bubble-pressure method of measuring surface tension described in *Langmuir* 1986, 2, 428-432, which is incorporated herein by reference in its entirety.

In embodiments where a non-aqueous solvent is used in addition to or in place of an aqueous solvent such as water, the non-aqueous solvent selected will not react with the at least one surfactant contained therein, other additives within the process solution, or the substrate itself. Suitable solvents include, but are not limited to, hydrocarbons (e. g. pentane or hexane); halocarbons (e. g. Freon 113); ethers (e. g. ethylether ($Et_2O$), tetrahydrofuran ("THF"), ethylene glycol monomethyl ether, or 2-methoxyethyl ether (diglyme)); nitriles (e. g. $CH_3CN$); or aromatic compounds (e.g. benzotrifluoride). Still further exemplary solvents include lactates, pyruvates, and diols. These solvents include, but are not limited to, acetone, 1,4-dioxane, 1,3-dioxolane, ethyl acetate, cyclohexanone, acetone, 1-methyl-2-pyrodidianone (NMP), and methyl ethyl ketone. Other solvents, include dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, and the like. Still further solvents include propylene glycol propyl ether (PGPE), methanol, ethanol, 3-heptanol, 2-methyl-1-pentanol, 5-methyl-2-hexanol, 3-hexanol, 2-heptano, 2-hexanol, 2,3-dimethyl-3-pentanol, propylene glycol methyl ether acetate (PGMEA), ethylene glycol, isopropyl alcohol (IPA), n-butyl ether, propylene glycol n-butyl ether (PGBE), 1-butoxy-2-propanol, 2-methyl-3-pentanol, 2-methoxyethyl acetate, 2-butoxyethanol, 2-ethoxyethyl acetoacetate, 1-pentanol, and propylene glycol methyl ether. The non-aqueous solvents enumerated above may be used alone or in combination with two or more solvents.

In certain embodiments, the process solution may contain at least one non-aqueous solvent that is miscible in an aqueous solvent or is water-miscible. In these embodiments, the amount of non-aqueous solvent within the process solution may range from about 1 to about 50% by weight with the balance of the solvent within the process solution comprising an aqueous solvent. Examples of water-miscible non-aqueous solvents include methanol, ethanol, isopropyl alcohol, and THF.

The present solution comprises from 10 to 10,000 ppm of at least one surfactant represented by structural formulas I through VIII. Typical surfactants exhibit an amphiphilic nature, meaning that they can be both hydrophilic and hydrophobic at the same time. Amphiphillic surfactants possess a hydrophilic head group or groups, which have a strong affinity for water and a long hydrophobic tail, which is organophilic and repels water. The at least one formula I through VIII surfactant used in the present invention may be ionic (i.e., anionic, cationic) or nonionic.

In certain embodiments of the present invention, the process solution may contain one or more nonionic surfactants that are acetylenic diol derivatives. The surfactants of the present invention may be represented by the following formula I or formula II:

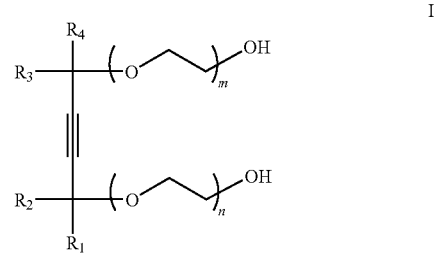

-continued

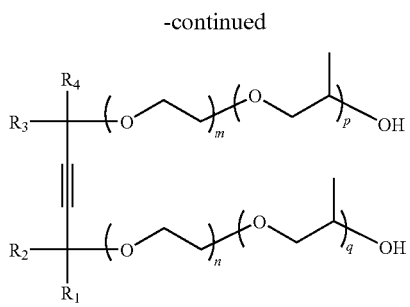

II wherein $R_1$ and $R_4$ are each independently a straight or a branched alkyl chain having from 3 to 10 carbon atoms; $R_2$ and $R_3$ are each independently a hydrogen atom or an alkyl chain having from 1 to 5 carbon atoms; and m, n, p, and q are each independently a number that ranges from 0 to 20. The surfactants are commercially available from Air Products and Chemicals, Inc. of Allentown, Pa., the assignee of the present invention, under the trade names SURFYNOL® and DYNOL®. In certain preferred embodiments, the acetylenic diol portion of the molecule of formulas I or II is 2,4,5,9-tetramethyl-5-decyne-4,7-diol or 2,5,8,11-tetramethyl-6-dodecyne-5,8-diol. The acetylenic diol derived surfactants may be prepared in a number of ways including the methods described, for example, in U.S. Pat. No. 6,313,182 and EP 1115035A1 which are assigned to the assignee of the present invention and incorporated herein by reference in their entirety.

In formula I and II, the alkylene oxide moieties represented by $(OC_2H_4)$ are the (n+m) polymerized ethylene oxide (EO) molar units and the moieties represented by $(OC_3H_6)$ are the (p+q) polymerized propylene oxide (PO) molar units. The value of (n+m) may range from 0 to 30, preferably from 1.3 to 15, and more preferably from 1.3 to 10. The value of (p+q) may range from 0 to 30, preferably from 1 to 10, and more preferably from 1 to 2.

In certain preferred embodiments of the present invention, the process solution contains from 10 to 10,000 ppm of at least one surfactant represented by the following formulas (III) through (VIII):

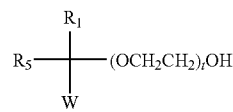

III

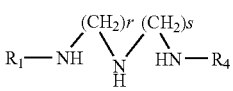

IVa

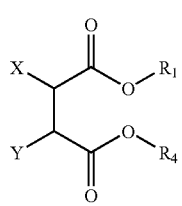

IVb

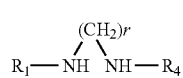

V

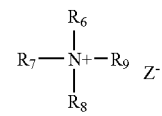

VI

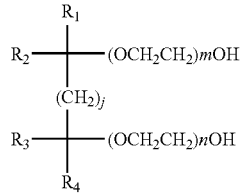

VII

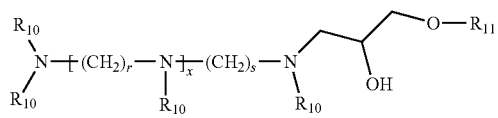

VIII

In each of the above formulas, $R_1$ and $R_4$ are each independently a straight or branched alkyl group with 3 to 10 carbon atoms; $R_2$ and $R_3$ are each independently a hydrogen atom or an alkyl group having from 1 to 5 carbon atoms; $R_5$ is a straight or branched alkyl group with 1 to 10 carbon atoms; $R_6$ is a straight or branched alkyl group with 4 to 16 carbon atoms; $R_7$, $R_8$ and $R_9$ are each independently a straight or branched alkyl group with 1 to 6 carbon atoms; $R_{10}$ is independently H or a group represented by the formula

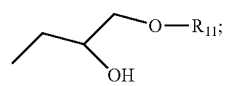

$R_{11}$ is a straight, branched, or cyclic alkyl group having from 4 to 22 carbon atoms; W is a hydrogen atom or an alkynyl group; X and Y are either a hydrogen atom or a hydroxyl group; $Z^-$ is either a halide atom, a hydroxyl group, an acetate group, or a carboxylate group; m, n, p, q are each independently a number ranging from 0 to 20; r and s are each independently 2 or 3; t is a number ranging from 0 to 2; j is a number ranging from 1 to 5; and x is a number ranging from 1 to 6. Examples of Formula III surfactants include, but are not limited to, 3,5-dimethyl-1-hexyn-3-ol and 2,6-dimethyl-4-heptanol. An example of a Formula IVb surfactant includes, but is not limited to, N,N'-bis(1,3-dimethylbutyl) ethylene diamine. An example of a Formula V surfactant includes, but is not limited to, diisopentyl tartrate. An example of a Formula VI surfactant includes, but is not limited to, dodecyltrimethylammonium chloride. An example of a Formula VII surfactant includes, but is not limited to, 2,4,7,9-tetramethyl-4,7-decane diol. An example of a Formula VIII surfactant includes, but is not limited to, an adduct of diethylenetriamine and n-butyl glycidyl ether.

The process solution may optionally contain a dispersant. The amount of dispersant that is added to the process solution ranges from about 10 to about 10,000 ppm, preferably about 10 to about 5,000 ppm, and more preferably from about 10 to about 1,000 ppm. The term dispersant, as used herein, describes compounds that enhance the dispersion of particles such as dust, processing residue, hydrocarbons, metal oxides, pigment or other contaminants within the process solution.

Dispersants suitable for the present invention preferably have a number average molecular weight that ranges from about 10 to about 10,000.

The dispersant may be an ionic or a nonionic compound. The ionic or nonionic compound may further comprise a copolymer, an oligomer, or a surfactant, alone or in combination. The term copolymer, as used herein, relates to a polymer compound consisting of more than one polymeric compound such as block, star, or grafted copolymers. Examples of a nonionic copolymer dispersant include polymeric compounds such as the tri-block EO-PO-EO co-polymers PLURONIC® L121, L123, L31, L81, L101 and P123 (BASF, Inc.). The term oligomer, as used herein, relates to a polymer compound consisting of only a few monomer units. Examples of ionic oligomer dispersants include SMA® 1440 and 2625 oligomers (Elf Alfochem).

Alternatively, the dispersant may comprise a surfactant. If the dispersant comprises a surfactant, the surfactant may be ionic (i.e., anionic, cationic) or nonionic. Further examples of surfactants include silicone surfactants, poly(alkylene oxide) surfactants, and fluorochemical surfactants. Suitable nonionic surfactants for use in the process solution include, but are not limited to, octyl and nonyl phenol ethoxylates such as TRITON® X-114, X-102, X-45, X-15 and alcohol ethoxylates such as BRIJ® 56 ($C_{16}H_{33}(OCH_2CH_2)_{10}OH$) (ICI), BRIJ® 58 ($C_{16}H_{33}(OCH_2CH_2)_{20}OH$) (ICI). Still further exemplary surfactants include alcohol (primary and secondary) ethoxylates, amine ethoxylates, glucosides, glucamides, polyethylene glycols, poly(ethylene glycol-co-propylene glycol), or other surfactants provided in the reference *McCutcheon's Emulsifiers and Detergents*, North American Edition for the Year 2000 published by Manufacturers Confectioners Publishing Co. of Glen Rock, N.J.

Various other additives may be optionally added to the process solution depending upon the application. These additives may include, but are not limited to, stabilizers, dissolving aids, colorants, wetting agents, antifoamers, buffering agents, and other additional surfactants. Generally, unless otherwise stated, the amount of each of these additives would be about 0.0001 to 1 percent by weight, more preferably 0.0001 to 0.1 percent by weight, based upon the total weight of the process solution. In embodiments where one or more additional surfactants are added to the process solution, the surfactant may be any of the surfactants disclosed herein or provided in the reference *McCutcheon's Emulsifiers and Detergents*.

In certain embodiments, the process solution of the present invention may be used as a non-aqueous photoresist. In this connection, the process solution preferably comprises from 60 to 90, preferably from 70 to 90 weight percent non-aqueous solvent; from 5 to 40 weight percent, preferably from 10 to 20 weight percent resist polymer; from 0.5 to about 2 weight percent of a photoactive compound; 10 to 10,000 ppm of at least one formula I through VIII surfactant; and less than 1 weight percent of other additives such as polymerization inhibitors, dyes, plasticizers, viscosity control agents, and the like. The viscosity of the photoresist can be adjusted by varying the polymer to solvent ratio, thus allowing resists to be formulated for coating a variety of film thickness. Examples of suitable non-aqueous solvents within the photoresist process solution include any of the solvents contained herein. Non-limiting examples of a resist polymer include novolac resin or polyvinyl phenol copolymer. Non-limiting examples of a photoactive compounds include diazonaphthoquinone or photo acid generators (PAG).

The process solution of the present invention may also be used as a non-aqueous edge bead remover. Edge bead removers may be applied prior to baking the patterned photoresist layer to cross-link the polymer therein or prior to lithography. In this embodiment, the process solution preferably comprises from 99 to 100 weight percent non-aqueous solvent; 10 to 10,000 ppm of at least one formula I through VIII surfactant; and less than 1 weight percent of other additives. Examples of suitable non-aqueous solvents within the edge bead remover process solution include any of the solvents contained herein. In certain preferred embodiments, the solvent may be PGMEA, ethyl lactate, or anisole.

The process solution of the present invention may also be used as an anti-reflective coating for the top or bottom surface of the substrate. In this embodiment, the process solution preferably comprises from 60 to 99 weight percent non-aqueous solvent; from 1 to 40 weight percent, preferably 1 to 20 weight percent of a polymer; from 10 to 10,000 ppm of at least one formula I through VIII surfactant; and less than 1 weight percent of other additives such as crosslinker(s), surfactant(s), dye compounds, and the like. In general, the solids content of the process solution may vary from about 0.5 to about 40, preferably 0.5 to about 20, and more preferably 2 to 10 weight percent of the total weight of the process solution. Examples of suitable non-aqueous solvents within the ARC process solution include any of the solvents contained herein. In certain preferred embodiments, the solvent may be PGMEA or ethyl lactate. Examples of suitable polymers within the ARC process solution include, but are not limited to, acrylate polymers or phenyl-containing polymers such as those disclosed in U.S. Pat. No. 6,410,209 and spin-on-glass materials such as the methylsiloxane, methylsilsesquioxane, and silicate polymers such as those disclosed in U.S. Pat. Nos. 6,268,457 and 6,365,765.

The process solution of the present invention may be used in wafer cleaning methods, such as RCA-type cleaning, performed after the development step. In this embodiment, the substrate may be treated with the process solution after the stripping, CMP, ash cleaning, and/or etching steps have been completed. In one embodiment of the present invention, the process solution comprises a base such as an amine and/or ammonium hydroxide, alkylammonium hydroxide; an oxidizing agent such as $H_2O_2$; optionally a chelating agent; from 10 to 10,000 ppm of at least one formula I through VIII surfactant; in an aqueous solvent or water. Some non-limiting examples of chelating agents are the following organic acids and its isomers and salts: (ethylenedinitrilo)tetraacetic acid (EDTA), butylenediaminetetraacetic acid, cyclohexane-1,2-diaminetetraacetic acid (CyDTA), diethylenetriaminepentaacetic acid (DETPA), ethylenediaminetetrapropionic acid, ethylenediaminetetrapropionic acid, (hydroxyethyl)ethylenediaminetriacetic acid (HEDTA), N,N,N',N'-ethylenediaminetetra(methylenephosphonic) acid (EDTMP), citric acid, tartaric acid, phtalic acid, gluconic acid, saccharic acid, cathechol, gallic acid, pyrogallol, propyl gallate, and cysteine. In an alternative embodiment, the process solution comprises dilute HF; from 10 to 10,000 ppm of at least one formula I through VIII surfactant; and water. In a further embodiment, the process solution comprises an acid such as sulfuric acid or HCl and an oxidizing agent such as $H_2O_2$ wherein the ratio of the acid to the oxidizing agent is 1:1; optionally a chelating agent; from 10 to 10,000 ppm of at least one formula I through VIII surfactant; and an aqueous solvent or water. In another embodiment, the process solution comprises an aqueous solvent such as electrolytic ionized water and from 10 to 10,000 ppm of at least one formula I through VIII surfactant. In yet another embodiment, the process solution comprises UV/ozone; from 10 to 10,000 ppm of at least one formula I through VIII surfactant; and water. For wafer cleaning applications, the process solution may be used for either megasonic or regular cleaning such as spray application.

The process solution of the present invention may be prepared by mixing the at least one formula I through VIII surfactant with an aqueous and/or non-aqueous solvents and any additional additives. In certain embodiments, the mixing may be done at a temperature range of about 40 to 60° C. to affect dissolution of the ingredients contained therein. The resulting process solution may optionally be filtered to remove any undissolved particles that could potentially harm the substrate.

The process solution is preferably used to treat the surface of a substrate during or after the development step. Suitable substrates include, but are not limited to, materials such as gallium arsenide ("GaAs"), silicon, tantalum, copper, ceramics, aluminum/copper alloys, polyimides, and compositions containing silicon such as crystalline silicon, polysilicon, amorphous silicon, epitaxial silicon, silicon dioxide ("$SiO_2$"), silicon nitride, doped silicon dioxide, and the like. Further exemplary substrates include silicon, aluminum, or polymeric resins.

In certain preferred embodiments, the process solution is applied to a substrate having a photoresist coating applied thereto. The photoresist-coated substrate is then exposed to radiation to provide a pattern that is imposed upon the photoresist coating. Examples of radiation sources that may be used include ultraviolet (uv) light, electron beam, x-ray, laser, or ion beams. In some embodiments, a pre-bake or soft-bake step may be conducted prior to the exposure step to remove any solvents contained therein. This pre-bake or soft bake step may be conducted, for example, at a temperature ranging from 90° C. to 150° C. for a time of from 30 to 120 seconds on a hot plate.

Depending upon whether the photoresist coating is positive or negative, the radiation either increases or decreased its solubility in a subsequently applied, an alkaline developer solution such as a process solution containing tetramethylammonium hydroxide (TMAH), potassium hydroxide, sodium hydroxide, or other base. Further examples of developer solutions include those provided in U.S. Pat. Nos. 6,455,234; 6,268,115; 6,238,849; 6,127,101; and 6,120,978. In a positive photoresist coating, the areas masked from radiation remain after development while the exposed areas are dissolved away. In a negative photoresist coating, the opposite occurs. The process solution of the present invention may be suitable to treat substrates having either positive or negative photoresist coatings. The patterned photoresist image may be developed by a variety of different means, including by not limited to quiescence, immersion, spray, or puddle development. In the quiescence method, for instance, a developer solution is applied to the exposed substrate surface and after a period of time sufficient to develop the pattern, a rinse is then applied to the substrate surface. Development time and temperatures will vary depending upon the method used.

After the patterned photoresist image is developed, the substrate is baked to harden the polymer contained within the photoresist. The bake step may be conducted, for example, at a temperature ranging from 70° C. to 150° C. for a time duration of from 30 to 120 seconds.

The process solution is preferably applied to the surface of the substrate as a prepared solution. In alternative embodiments, however, the process solution can be prepared within the rinse stream just prior to or during contact with the substrate surface. For example, a certain quantity of one or more formula I through VIII surfactants can be injected into a continuous stream of water and/or non-aqueous solvent medium that optionally includes other additives thereby forming the process solution. In some embodiments of the present invention, a portion of the at least one formula I through VIII surfactant may be added to the substrate after application of the process solution. In this case, the process solution may be formed in multiple steps during the processing of the substrate. In still other embodiments of the present invention, the at least one formula I through VIII surfactant can be also deposited upon or comprise the material of a high surface area device such as a cartridge or filter (which may or may not include other additives). A stream of water and/or non-aqueous solvent then passes through the cartridge or filter thereby forming the process solution. In still another embodiment of the present invention, the process solution is prepared during the contacting step. In this connection, at least one formula I through VIII surfactant is introduced via a dropper or other means to the surface of the substrate. Water and/or non-aqueous solvent medium is then introduced to the surface of the substrate and mixes with the at least one formula I through VIII surfactant on the surface of the substrate thereby forming the process solution.

In an alternative embodiment of the invention, a concentrated composition comprising at least one formula I through VIII surfactant is provided that may be diluted in water and/or non-aqueous solvents to provide the process solution. A concentrated composition of the invention, or "concentrate" allows one to dilute the concentrate to the desired strength and pH. A concentrate also permits longer shelf life and easier shipping and storage of the product.

A variety of means can be employed in contacting the process solution with the substrate surface. The actual conditions of the contacting step (i.e., temperature, time, and the like) may vary over wide ranges and are generally dependent on a variety of factors such as, but not limited to, the nature and amount of residue on the surface of the substrate and the hydrophobicity or hydrophilicity of the substrate surface, etc. The contact step can be conducted in either a dynamic method such as, for example, a streamline process for applying the process solution over the surface of the substrate or in a static method such as, for example, a puddle rinse or immersing the substrate within a bath containing the process solution. The process solution may also be sprayed onto the surface of the substrate in a dynamic method such as in a continuous process or sprayed onto the surface and allowed to remain there in a static method. In certain preferred embodiments, the contacting step is conducted in a static method. The duration of the contacting step, or time of contact of the process solution to the substrate surface, can vary from a fraction of a second to hundreds of seconds. Preferably, the duration can range from 1 to 200 seconds, preferably from 1 to 150 seconds, and more preferably from 1 to 40 seconds. The temperature range for the contacting step can vary from 10 to 100° C. and more preferably from 10 to 40° C.

Regardless of whether the contacting step is static or dynamic, it is preferred that the process solution or concentrate be applied to a still-wet substrate surface. In a preferred embodiment, for example, the process solution is employed as a rinse solution after the development of the photoresist layer. In this connection, the photoresist-coated substrate is developed via a developer solution. After developing, the process solution is applied to the substrate surface as a rinse in addition to, or in place of, a deionized water rinse. While the substrate is still wet with developer solution and/or deionized water, the process solution may be applied in a dynamic manner or in a static manner such as by puddling it onto the surface of the substrate. During dispensing, the substrate is spun slowly at a speed, for example, of 100 revolutions per minute ("rpm") to distribute the process solution over the substrate surface. For a dynamic process, the substrate is spun slowly while the process solution is dispensed continuously on the substrate. For a static process such as the puddle process, the substrate is allowed to rest for a brief period, for example, 15 seconds. After the rinse step with the process solution is complete, the rinsed wafer is then dried, for example, by spin drying at a higher rpm.

In yet a further embodiment of the present invention, there is provided a method for selecting the process solution comprising at least one formula I through VIII surfactant that will minimize the number of pattern collapse defects for patterned, photoresist-coated substrates. In this regard, the method comprises determining the surface tension and the measuring the contact angle of a process solution containing from 10 to 10,000 ppm of the at least one surfactant. The process solution is first applied to the surface of a sample photoresist-coated substrate. The surface tension, preferably dynamic surface tension, of the process solution may be determined according to the maximum-bubble-pressure method as described herein. The contact angle of the process solution, which is the angle between the baseline of a droplet of process solution on the surface of the substrate and the tangent at the droplet base, is then measured. In certain preferred embodiments, a high-speed camera may be used to capture the spreading of the droplet at a speed of 2 frames per second for a 2 minute interval and the contact angle can be measured on the photographic image.

Once the surface tension and contact angle for the process solution is obtained, the surface tension is then multiplied by the cosine of the contact angle measurement to provide a certain value referred to herein as an "adhesion tension value". Lower adhesion tension values for the process solution correlate to a greater reduction in pattern collapse defects. Adhesion tension values of 30 or less indicate, preferably 25 or less, or more preferably 20 or less indicate that the process solution may be more effective in reducing the number of pattern collapse defects compared to deionized water rinse solutions or process solutions containing other surfactants described in the prior art. If the adhesion tension value is acceptable (i.e., 30 or less), the process solution may then be used for a production lot. The concentration of the formula I through VIII surfactant is determined by the smallest adhesion tension value calculated at different concentrations for each surfactant. In certain preferred embodiments, the process solution reduced the number of pattern collapse defects by 25% or greater, preferably 50% or greater, and more preferably 75% or greater relative to a deionized water rinse for patterned and developed photoresist coated substrates having an aspect ratio of 3.0 or greater, and a pitch of 1:1.4 or greater, or a normalized aspect ratio of at least 0.015 1/nm.

The invention will be illustrated in more detail with reference to the following examples, but it should be understood that the present invention is not deemed to be limited thereto.

EXAMPLES

Examples 1 through 5

Dynamic Surface Tension (DST)

Five process solutions containing acetylenic diol surfactants derived from 2,4,7,9-tetramethyl-5-decyne-4,7-diol (examples 1 through 3) or 2,5,8,11-tetramethyl-6-dodecyne-5,8-diol (examples 4 and 5) were prepared by adding 0.1 weight percent of the surfactant to deionized water under continuous stirring.

The dynamic surface tension (DST) data for each process solution was collected via the maximum bubble pressure method described in Langmuir 1986, 2, pp. 428-432. The data was collected at bubble rates that range from 0.1 bubbles/second (b/s) to 20 b/s using the Kruss BP2 bubble pressure tensiometer manufactured by Kruss, Inc. of Charlotte, N.C. The molar units of EO and PO for each example and dynamic surface tension data is provided in Table I.

The dynamic surface tension data provides information about the performance of a surfactant at conditions from near-equilibrium (0.1 b/s) to relatively high surface creation rates (20 b/s). For applications such as semiconductor or IC processing, high bubble rates may correspond to a faster substrate rotation speed or a dynamic dispense in a post-development rinse process. It is desirable that the dynamic surface tension by reduced below that of water at high bubble rates (i.e., 70-72 dyne/cm at 20 b/s) to provide, inter alia, better wetting of the photoresist-coated substrate, reduction in the number of defects, and prevention of pattern collapse. As Table I illustrates, all of the process solutions exhibited dynamic surface tensions at high bubble rates below that of water. This indicates that the process solutions of the present invention may be effective at reducing the surface tension of water.

TABLE I

| | | | Dynamic Surface Tension | | | | |
|---|---|---|---|---|---|---|---|
| Example | Moles EO (m + n) | Moles PO (p + q) | DST (dyne/cm) 0.1 b/s | DST (dyne/cm) 1 b/s | DST (dyne/cm) 6 b/s | DST (dyne/cm) 15 b/s | DST (dyne/cm) 20 b/s |
| 1 | 5 | 2 | 34.0 | 35.3 | 37.6 | 41.5 | 44.3 |
| 2 | 5 | 0 | 35.1 | 35.2 | 38.1 | 42.0 | 44.4 |
| 3 | 0 | 0 | 32.1 | 33.1 | 34.2 | 36.1 | 40.3 |
| 4 | 0 | 0 | 34.1 | 43.6 | 58.1 | 68.3 | 69.8 |
| 5 | 4 | 0 | 26.8 | 26.8 | 31.5 | 35.9 | 39.1 |

Examples 5 through 7

Foaming Properties

Three process solutions containing acetylenic diol surfactants derived from 2,4,7,9-tetramethyl-5-decyne-4,7-diol (examples 5 and 6) or 2,5,8,11-tetramethyl-6-dodecyne-5,8-diol (example 7) were prepared by adding 0.1 weight percent of each surfactant to deionized water under continuous stirring.

Foaming is an undesirable side effect of surfactants in rinse solution. The foaming properties of examples 5 through 7 were examined using a procedure based upon ASTM D 1173-

53, the Ross-Miles test method, and the results are provided in Table II. In this test, a 200 ml quantity of each process solution is added from an elevated foam pipette to a foam receiver containing the 50 ml of the same solution at room temperature. The Ross-Miles method stimulates the action of pouring a liquid into a cylindrical vessel containing the same liquid. The results are given in Table II. The foam height is measured at the completion of the addition ("Initial Foam Height") and the time required for the foam to dissipate is recorded ("Time to 0 Foam"). In certain applications, foam may be undesirable because it may lead to defects due to the failure to adequately coat the surface of the substrate. As Table II indicates, the time to reach zero foam is approximately one minute or less.

The process solution of Example 5 was also compared to process solutions containing 0.1 weight percent of a fluorosurfactant (perfluoroalkyl ethoxylate) and an ionic surfactant (sodium lauryl sulfate) using the Ross-Miles test. The results of this comparison are provided in Table III. As Table III shows, solutions containing the fluorosurfactant and ionic surfactant still exhibited significant foam at intervals of 5 or 10 minutes. In semiconductor processing applications, the presence of significant foam may be undesirable and may lead to an increase in processing defects.

TABLE II

Foaming Properties

| Example | Moles EO (m + n) | Moles PO (p + q) | Initial Foam Height (cm) | Time to Zero Foam (sec) |
|---|---|---|---|---|
| 5 | 5 | 2 | 0.6 | 6 |
| 6 | 0 | 0 | 2.0 | 3 |
| 7 | 4 | 0 | 2.5 | 60 |

TABLE III

Comparison of Foam Properties with Solutions containing other Surfactants

| Rinse Composition | Initial Foam Height (cm) | Foam Height at 6 sec (cm) | Foam Height at 5 min (cm) | Foam Height at 5 min (cm) |
|---|---|---|---|---|
| Example 5 | 0.6 | 0 | 0 | 0 |
| Fluorosurfactant (0.1 weight %)[1] | 14.5 | 14.5 | N/A | 13.5 |
| Ionic surfactant (0.25 weight %)[2] | 22.0 | 22.0 | 20.0 | N/A |

[1]Information obtained from DuPont ZONYL ® marketing literature.
[2]Information obtained from Weil, J. K., et al., "Synthetic Detergents from Animal Fats: the Sulfonation of Tallow Alcohols", J. Am. Oil Chem. Soc. 31, p. 444-47 (1954).

Examples 8 through 9

Contact Angle Data

The wetting properties of process solutions containing varying amounts of surfactants derived from 2,4,7,9-tetramethyl-5-decyne-4,7-diol (examples 8a and 8b) or 2,5,8,11-tetramethyl-6-dodecyne-5,8-diol (examples 9a and 9b) and DI water as a comparison (comparative example 1) was measured on the G10/DSA10 Kruss drop shape analyzer provided by Kruss USA of Charlotte, N.C. using the Sessile drop method. In this method, the wetting properties of a localized region on the surface of a photoresist-coated substrate are estimated by measuring the contact angle between the baseline of a droplet of aqueous developer solution and the tangent at the droplet base. A high-speed camera captured the spreading of the droplet at a speed of 2 frames per second for 2 minutes and the contact angle was measured.

Process solutions of surfactant based on 2,4,7,9-tetramethyl-5-decyne-4,7-diol and 2,5,8,11-tetramethyl-6-dodecyne-5,8-diol were prepared in the following manner. A volumetric flask was charged with varying amounts of the surfactant and DI water to reach a level of 100 ml at room temperature. The mixture was agitated until the surfactant was dissolved therein to form the process solution. The amounts of surfactant in the process solutions of examples 8a, 8b, 9a and 9b are provided in Table IV.

Silicon wafers provided by Wafernet Inc. of San Jose, Calif. were coated with a AX 4318 photoresist coating provided by Sumitomo Chemical Co., Ltd. of Osaka, Japan using a spin coating process at a spin speed of 3200 rpm. The contact angle of the process solution on the photoresist surface was measured. Table IV provides the value of the contact angle for the process solutions and DI water (comparative example 1) at different drop ages expressed in seconds.

In general, contact angles of about 20° or below may indicate complete wetting of the substrate surface. As Table IV illustrates, the contact angles of TMAH developer on the photoresist-coated substrate that were treated with the process solutions of the present invention are smaller than the contact angle of the photoresist treated with DI water. Further, higher amounts of surfactant within the process solution may lead to more surfactant adsorption and improved wetting.

TABLE IV

| Example | Amt Surfactant | Contact Angle (0 sec) | Contact Angle (5 sec) | Contact Angle (10 sec) | Contact Angle (30 sec) |
|---|---|---|---|---|---|
| Comp. Ex. 1 - DI water | — | 61.8 | 61.7 | 61.5 | 61.1 |
| Ex. 8a | 125 ppm | 47.3 | 46.9 | 46.5 | 45.4 |
| Ex. 8b | 600 ppm | 47.3 | 42.6 | 40.6 | 36.4 |
| Ex. 9a | 100 ppm | 50.0 | 46.8 | 45.0 | 41.6 |
| Ex. 9b | 350 ppm | 40.0 | 29.4 | 25.3 | 17.2 |

Example 10

Number of Post-Development Defects after DI Rinse vs. Process Solution Rinse

The number of post-development defects on a substrate was compared after treating the substrate with a rinse of DI water (comparative example 2) vs. a rinse containing the process solution of the present invention (example 10). The process solution contained 50 ppm of a 2,5,8,11-tetramethyl-6-dodecyne-5,8-diol-derived surfactant and 170 ppm of the oligomer dispersant SMA® 1440 provided by Elf Alfochem. The substrate was processed in the following manner: a photoresist-coated substrate was exposed to a 365 nm light, heated to a temperature of approximately 110° C. for a time of about 1 minute and then developed to form a patterned photoresist with a dilute TMAH solution. The TMAH solution was applied by dynamically dispensing a 0.21 N TMAH solution onto the substrate for a period of 100 seconds.

In comparative example 2, a rinse containing DI water started 15 seconds before the developer nozzle was turned off and continued for a period of 7 minutes. The substrate was inspected for defects using the TereStar® KLA-Tencor defect inspection tool provided by KLA-Tencor Inc. of San Jose, Calif. and the defects were classified and counted. The results of the inspection are provided in Table V.

The substrate was processed in the same manner as in comparative example 2 using the same developer and process conditions. However, after 100 seconds of developing, a process solution comprising an acetylenic diol surfactant (example 10) was used to rinse the patterned photoresist-coated surface. The overlapping period with the developer was the same as in comparative example 2. After a 120 second rinse with the process solution, a DI water rinse was used for another 7 minutes. The substrate was inspected for defects using the TereStar® KLA-Tencor defect inspection tool and the defects were classified and counted. The results of the inspection are provided in Table VI.

As Table VI illustrates, the process solution of the present invention was able to completely remove the photoresist residues from the patterned photoresist surface. By contrast, Table V shows that were many defects resulting from residual photoresist and other sources after rinsing with DI water. Therefore, rinsing the substrate with the process solution of the present invention effectively eliminated the number of post-development defects and improved the process yield.

TABLE V

Post-Development Defects after DI Water Rinse

| Defect Types | Small | Medium | Large | Extra large | Total |
|---|---|---|---|---|---|
| Pattern Defect | 0 | 55 | 35 | 1 | 91 |
| Pinholes/Dots | 0 | 148 | 2 | 0 | 150 |
| Total | 0 | 203 | 37 | 1 | 241 |

TABLE VI

Post-Development Defects after Process solution Rinse

| Defect Types | Small | Medium | Large | Extra large | Total |
|---|---|---|---|---|---|
| Pattern Defect | 0 | 0 | 0 | 0 | 0 |
| Pinholes/Dots | 0 | 0 | 0 | 0 | 0 |
| Total | 0 | 0 | 0 | 0 | 0 |

Example 11

Comparison of Equilibrium Surface Tension and Dynamic Surface Tension of Process Solution vs. Solutions Containing Fluorosurfactant Process solutions containing 0.1 weight percent of a surfactant derived from 2,5,8,11-tetramethyl-6-dodecyne-5,8-dioland a fluorosurfactant, potassium perfluorooctane carboxylate provided by 3M of St. Louis, Mo. were prepared in order to compare the equilibrium surface tension (EST) and dynamic surface tension (DST). The EST for both solutions was measured using the Wilhemy plate method on a Kruss BP2 bubble pressure tensiometer manufactured by Kruss, Inc. of Charlotte, N.C. The DST of each process solution was measured via the maximum bubble pressure method used in examples 1 through 5. The results of the EST and DST tests are provided in Table VII.

Referring to Table VII, while the fluorosurfactant exhibits a lower EST compared to the process solution of the present invention, the significantly lower DST indicates that the fluorosurfactant exhibits poor dynamic surface tension reduction ability. For applications that require high surface creation rates such as dynamic rinse processes used in semiconductor manufacturing, the process solution of the present invention would be more suitable than solutions containing fluorosurfactants due to its lower DST value.

TABLE VII

| Rinse Composition (0.1 wt %) | EST (dyne/cm) | DST (cm/cm) |
|---|---|---|
| Example 11 | 25.8 | 28.4 |
| Fluorosurfactant | 21.2 | 72.4 |

Examples 12 through 18

Determination of the Adhesion Tension Value of Process Solutions of the Present Invention Seven process solutions containing surfactants having the formulas I through VIII were prepared by adding less than 1 weight percent of the surfactant to deionized water under continuous stirring. The concentration of surfactant within each process solution is provided in Table VIII and is determined by the smallest adhesion tension value calculated at different concentrations for each surfactant. Example 12 contained 3,5-dimethyl-1-hexyn-3-ol (Formula III). Example 13 contained 2,6-dimethyl-4-heptanol provided by Aldrich (Formula III). Example 14 contained N,N'-bis(1,3-dimethylbutyl)ethylenediamine (Formula IVb). Example 15 contained diisopentyl tartrate (Formula V). Example 16 contained dodecyltrimethylammonium chloride (Formula VI). Example 17 contained 2,4,7,9-tetramethyl-4,7-decane diol (Formula VII). Example 18 contained 2,5,8,11-tetramethyl-6-dodecyne-5,8-diol-derived surfactant (Formula II). Examples 19, 20, and 21 each contained 1:3 adduct (0.05 wt % concentration), 1:5 adduct (0.012 wt % concentration), and 1:5 adduct (0.03 wt % concentration), respectively, of diethylenetriamine (x=2) and n-buyl glycidyl ether (Formula VIII).

The dynamic surface tension (DST) data for each process solution was collected via the maximum bubble pressure method described in Langmuir 1986, 2, pp. 428-432. The data was collected at bubble rates that range from 0.1 bubbles/second (b/s) to 20 b/s using the Kruss BP2 bubble pressure tensiometer manufactured by Kruss, Inc. of Charlotte, N.C. The surface tension values at 0.1 bubbles/second for each process solution are provided in Table VIII.

Silicon wafers provided by Wafernet Inc. of San Jose, Calif. were coated with 300 nm thick TOK 6063 193 nm photoresist coating provided by Tokyo Ohka Kogyo Co., Ltd. of Tokyo, Japan. The contact angle of the process solution on the photoresist surface was measured on the G10/DSA10 Kruss drop shape analyzer provided by Kruss USA of Charlotte, N.C. using the Sessile drop method. Table VIII provides the contact angle for each process solution measured at a drop age of 10 seconds.

The adhesion tension values for each process solution was calculated by multiplying the surface tension and the cosine of the contact angle. The results of this calculation are provided in Table VIII. As Table VIII illustrates, all of the process solutions have an adhesion tension value below 25. Examples 13, 14, 16, 19, 20, and 21 each had an adhesion value below 20. This indicates that these process solutions may reduce the number of pattern collapse defects to a greater degree than a process solution having one or more surfactants with a higher adhesion tension value.

TABLE VIII

Adhesion Tension Values

| | Examples | | | | | | | | | |
|---|---|---|---|---|---|---|---|---|---|---|
| | 12 | 13 | 14 | 15 | 16 | 17 | 18 | 19 | 20 | 21 |
| Concentration (wt %) | 0.9 | 0.12 | 0.095 | 0.05 | 4 | 0.05 | 0.045 | 0.05 | 0.012 | 0.03 |
| Surface Tension (ST) (dynes/cm) | 36.6 | 41.4 | 32.0 | 35.4 | 41.5 | 38.4 | 25.8 | 38.7 | 37.9 | 35.6 |
| Contact Angle (θ) | 55.0 | 70.7 | 53.1 | 45.5 | 62.7 | 56.1 | 28.1 | 59 | 59.2 | 59.7 |
| Adhesion Tension Value | 21.0 | 13.6 | 19.2 | 24.8 | 19.0 | 21.4 | 22.8 | 19.9 | 19.4 | 17.9 |

Pattern Collapse Reduction

Example 12, 14, and 17 process solutions were prepared by adding 0.9 weight % of 3,5-dimethyl-1-hexyn-3-ol, 0.095 weight % of N,N'-bis(1,3-dimethylbutyl) ethylenediamine, and 0.05 weight percent of 2,4,7,9-tetramethyl-4,7-decane diol, respectively, to deionized water under continuous stirring. A substrate was processed in the following manner: a silicon wafer provided by Wafernet, Inc. and coated with an anti-refelective coating was coated with a TOK 6063 193 nm photoresist and exposed to a 193 nm light with a ASML PAS 5500/1100 scanner, heated to a temperature of approximately 115° C. for a time of about 1 minute, and then developed to form a patterned photoresist with a dilute TMAH solution. The TMAH developer solution was applied by dynamically dispensing a 0.26N TMAH solution onto the substrate and allowed to set for a period of 45 seconds. The process solution was then dynamically dispensed onto the substrate surface while the wafer substrate slowly spun at 500 rpm to distribute the solution on the substrate surface. The dispense process lasted for a period of 15 seconds. Afterwards, the substrate was spun at 3,500 rpm to dry.

In a comparative example, a deionized water rinse solution was applied the substrate surface after the development of the patterned photoresist coating with a TMAH developer solution under the same process conditions as the Example 12, 14, and 17 process solutions.

Figure 1B:
FIG. 1b provides a cross-sectional SEM image of a 193 nm photoresist coated substrate having 80 nm dense lines, a 1:1 pitch, and a 3.75 aspect ratio that has been treated with a process solution of the present invention.

Silicon wafers treated with a post-development rinse of the process solution of the present invention and a deionized water post-development rinse were compared under scanning electron microscopy. FIGS. 1a and 1b provide cross-sectional SEM images of 80 nm dense lines with 1:1 pitch using a deionized water rinse and a rinse employing the Example 14 process solution, respectively. Referring to FIG. 1b, employing the process solution of the present invention as a post-development rinse solution in addition to or in lieu of deionized water minimizes or reduces the incidence of pattern collapse and preserves line definition.

The critical dimensions (CD) of the features of each wafer were measured with a Hitachi CD-SEM tool on 37 sites per wafer, and pattern collapse was visually observed through the top-down SEM images. The wafers were exposed under the same dose energy of 16.5 mJ/cm$^2$. The results of the visual observations are provided in Table IX.

As shown in Table IX, the process solutions of the present invention reduced the collapsed sites by at least half while increasing the aspect ratio from 3 to 3.3. Therefore, rinsing the substrate with the process solution of the present invention rather than with deionized water effectively reduced the pattern collapse when patterning high aspect ratio features.

TABLE IX

Pattern Collapse Data

| Rinse Solution | Aspect Ratio | % sites with collapsing |
|---|---|---|
| DI Water | 3.0 | 97 |
| Example 12 | 3.3 | 48 |
| Example 14 | 3.2 | 3 |
| Example 17 | 3.1 | 6 |

While the invention has been described in detail and with reference to specific examples thereof, it will be apparent to one skilled in the art that various changes and modifications can be made therein without departing from the spirit and scope thereof.

We claim:

1. A method for reducing the number of pattern collapse defects during the manufacture of semiconductor devices, the method comprising:
   providing a substrate comprising a photoresist coating;
   exposing the substrate to a radiation source to form a pattern on the photoresist coating;
   applying a developer solution to the substrate to form a patterned photoresist coating;
   optionally rinsing the substrate with deionized water; and
   contacting the substrate with a process solution consisting of at least one solvent and 10 ppm to about 10,000 ppm of at least one surfactant having the formula (IVa):

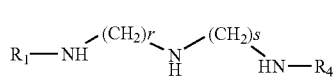

IVa wherein $R_1$ and $R_4$ are each independently a straight or a branched alkyl group having from 3 to 10 carbon atoms; and r and s each independently 2 or 3.

2. The method of claim 1 wherein the contacting step comprises a dynamic rinse.

3. The method of claim 1 wherein the contacting step comprises a static rinse.

4. The method of claim 1 wherein the surface of the substrate in the contacting step is wet with the developer solution.

5. The method of claim 1 wherein the surface of the substrate in the contacting step is wet with the deionized water rinse.

6. The method of claim 1 wherein the solvent comprises an aqueous solvent.

7. The method of claim 6 wherein the solvent comprises a non-aqueous solvent wherein the non-aqueous solvent is miscible in the aqueous solvent.

8. The method of claim 1 wherein the process stream is formed by injecting 10 to 10,000 ppm of the at least one surfactant into the solvent.

9. The method of claim 1 wherein the process stream is formed by applying 10 to 10,000 ppm of the at least one surfactant onto the surface of the substrate and applying the solvent to the substrate surface.

10. The method of claim 1 wherein the process stream is formed by passing the solvent through a cartridge comprising the at least one surfactant.

11. The method of claim 1 wherein a time of the contacting step ranges from 1 to 200 seconds.

12. The method of claim 11 wherein the time of the contacting step ranges from 1 to 150 seconds.

13. The method of claim 12 wherein the time of the contacting step ranges from 1 to 40 seconds.

14. The method of claim 1 wherein an at least one temperature of the contacting step ranges from 10 to 100° C.

15. The method of claim 1 wherein the solvent comprises a non-aqueous solvent.

* * * * *